United States Patent [19]

Nagano

[11] 4,084,134
[45] Apr. 11, 1978

[54] VOLTAGE DETECTOR WITH FIELD EFFECT TRANSISTOR AND HIGH INPUT IMPEDANCE

[76] Inventor: Hideo Nagano, No. 13-5, 5-chome, Shimomeguro, Meguro-ku, Tokyo, Japan

[21] Appl. No.: 698,814

[22] Filed: Jun. 23, 1976

[30] Foreign Application Priority Data

| Jul. 11, 1975 | Japan | 50-85166 |
| Jul. 26, 1975 | Japan | 50-103531[U] |
| Sep. 10, 1975 | Japan | 50-124473[U] |
| Feb. 14, 1976 | Japan | 51-16633[U] |
| Mar. 23, 1976 | Japan | 51-30803 |

[51] Int. Cl.$^2$ .............. G01R 19/16; G01R 31/02
[52] U.S. Cl. .......................... 324/133; 324/72.5
[58] Field of Search ............. 324/51, 72, 72.5, 53, 324/133, 149; 340/258 C, 258 D, 248 B, 248 C; 307/205, 350

[56] References Cited

U.S. PATENT DOCUMENTS

| 2,666,894 | 1/1954 | Babernitsh | 324/53 |
| 2,832,930 | 4/1958 | Hays | 324/53 |
| 2,917,705 | 12/1959 | Clough | 324/72.5 X |
| 2,942,189 | 6/1960 | Shea et al. | 324/133 |
| 3,444,465 | 5/1969 | Teixeira | 324/72.5 |
| 3,452,346 | 6/1969 | Kupersmit | 324/72 X |
| 3,828,256 | 8/1974 | Liu | 324/133 |
| 3,863,149 | 1/1975 | Johnson | 324/133 X |
| 3,878,459 | 4/1975 | Hanna | 324/133 X |

FOREIGN PATENT DOCUMENTS 1,931,994  1/1970  Germany .................. 324/51

Primary Examiner—Gerard R. Strecker
Attorney, Agent, or Firm—Haseltine, Lake & Waters

[57] ABSTRACT

A voltage detector particularly suitable for a portable type lineman's detector comprises an electrically insulating casing, a metal probe having a rear portion inserted into the casing and a front portion projected from the casing, a field effect transistor, a gate electrode of which is coupled to the rear portion of the probe, a transistor having a base connected to a drain electrode of the field effect transistor, a light emitting diode connected in series with an emitter-collector path of the transistor, a D.C. battery means connected across a series circuit of the emitter-collector path and the light emitting diode and a high input resistor connected across the probe and a first junction point between the light emitting diode and the D.C. battery means, wherein a source electrode of the field effect transistor is connected to a second junction point between the transistor and the light emitting diode. When the front portion of the probe is made contact with a conductor with or without inserting insulating body therebetween a voltage is induced at the gate electrode of the field effect transistor so as to make conductive the transistor and the light emitting diode produces light which can be seen from the external of the casing.

14 Claims, 19 Drawing Figures

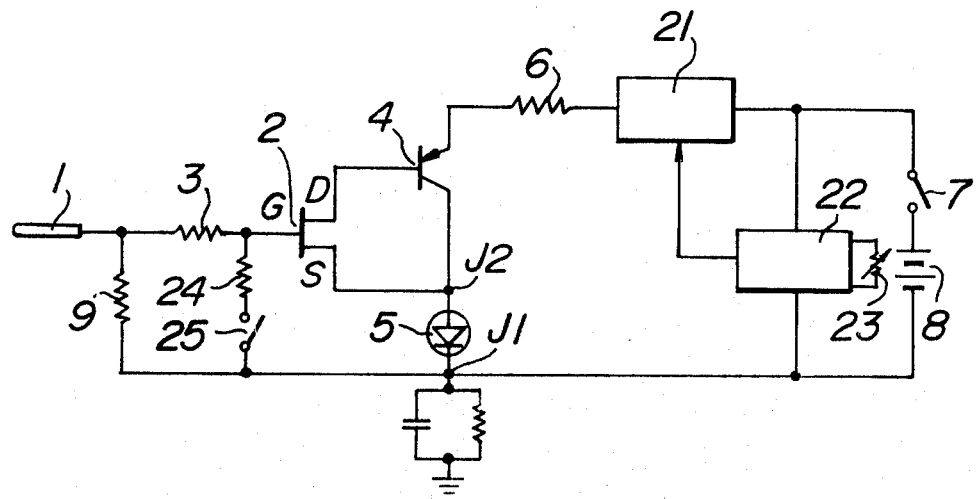
FIG._3
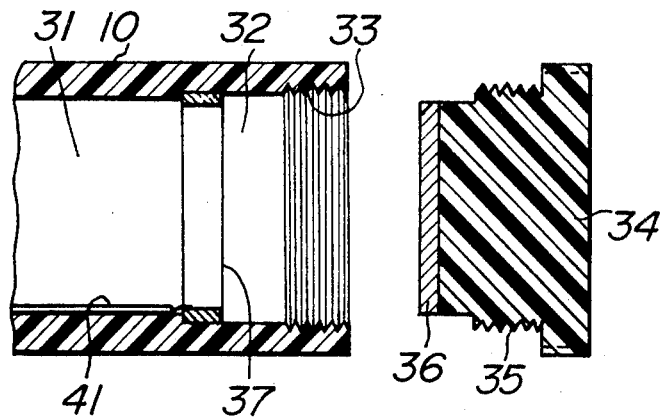
FIG._4

FIG_5
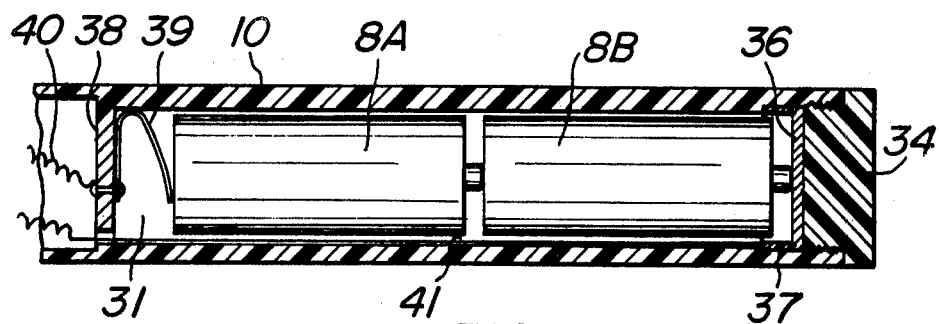
FIG_6
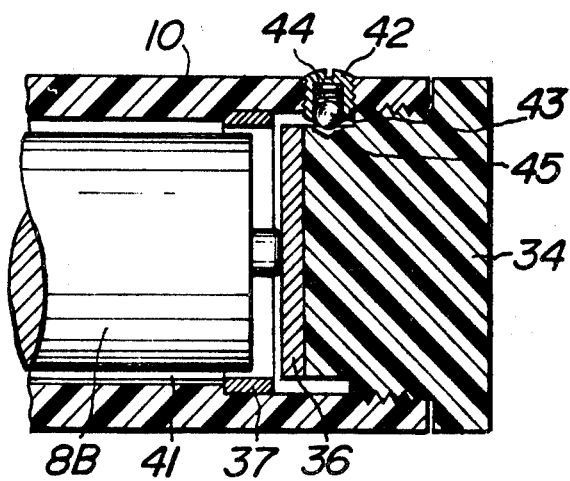
FIG_7
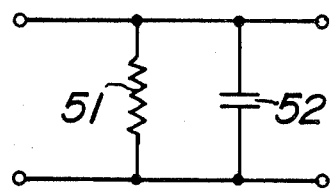

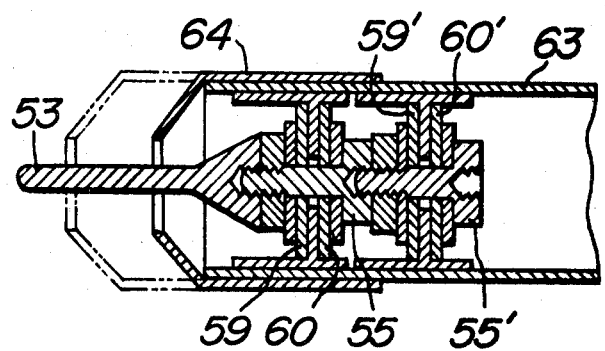
FIG._10
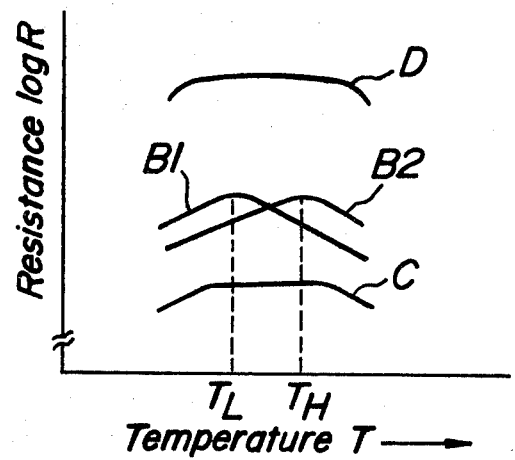
FIG._11

VOLTAGE DETECTOR WITH FIELD EFFECT TRANSISTOR AND HIGH INPUT IMPEDANCE

BACKGROUND OF THE INVENTION

The present invention relates to an apparatus for detecting a voltage and more particularly to a portable type voltage detector generally called as a lineman's detector.

Hithertofore several types of the voltage detectors have been known. The most widely used voltage detector is of a neon tube type which comprises a probe made of electrically conductive material, a casing made of electrically insulating material and having embedded therein a rear portion of the probe and a neon tube having one terminal connected to the rear end of the probe. When the exposed front portion of the probe is made contact with an electrically conductive member to which a voltage is applied, a current flows through the probe, neon tube and a body of a user to the ground and the neon tube is fired, so that the user can detect a fact that the voltage is applied to the electrically conductive member to which the probe is touched. This type of voltage detector can be manufactured very easily and is small in size and light in weight, and thus has been widely used as the lineman's detector. However by means of this type of voltage detector it is impossible to detect a voltage with interposing an electrical insulator between the conductor and the probe. For example, when the probe is made contact with an electrically insulating coating or sheath of an electric wire, the neon tube does not fire even if a voltage is applied to a core conductor surrounded by the insulating coating. It is very convenient and is sometimes required to detect the voltage applied to the core conductor without directly contacting the probe to the core conductor. An amplification type voltage detector has been also known, but this type of voltage detector is used for a rather high voltage and is very large in size and heavy in weight and thus is not suitable as the portable type lineman's detector. Moreover the sensitivity of this detector for low voltage from several tens voltage to several hundreds voltage is very low and the voltage cannot be detected with interposing the insulating material.

SUMMARY OF THE INVENTION

It is an object of the invention to provide a voltage detector which has a sufficiently high sensitivity and can detect a voltage applied to a conductor even with interposing an insulating member between a probe and the conductor.

It is another object of the invention to provide a voltage detector, particularly suitable for a lineman's detector which is small in size and light in weight and has a high resolution as well as a high sensitivity.

It is still another object of the invention to provide a voltage detector which can distinguish an A.C. voltage from an electrostatic voltage as well as A.C. voltages of different frequencies.

According to the invention a voltage detector comprises
- a casing made of electrically insulating material;
- a probe made of electrically conductive metal and having a rear portion embedded in a front end of the casing and a front portion projected from the front end of the casing;
- a field effect transistor having gate, source and drain electrodes, the gate electrode being connected to the rear portion of the probe;
- a transistor having emitter, collector and base, the base being connected to the drain electrode of the field effect transistor;
- a light emitting diode connected in series with the emitter-collector path of the transistor;
- a D.C. power source such as dry battery cells having two terminals connected across a series circuit of the emitter-collector path and light emitting diode; and
- a high input resistance connected between the probe and a junction of the light emitting diode and the D.C. power source.

BRIEF DESCRIPTION OF THE DRAWINGS

FIG. 3 is a circuit diagram showing a construction of a second embodiment of the voltage detector according to the invention;

FIG. 4 is a cross sectional view depicting a construction of a part of a battery accomodating space of the voltage detector according to the invention;

FIG. 5 is a cross sectional view showing the whole construction of the battery accommodating space;

FIG. 6 is a cross section illustrating an end portion of another embodiment of the battery accommodating space;

FIG. 7 is an equivalent circuit of an input circuit of the voltage detector according to the invention;

FIG. 10 is a cross sectional view showing another embodiment of the input device of the voltage detector according to the invention;

FIG. 11 is a graph illustrating temperature characteristics of the input resistance device of FIG. 10;

DESCRIPTION OF THE PREFERRED EMBODIMENT

Figure 1:
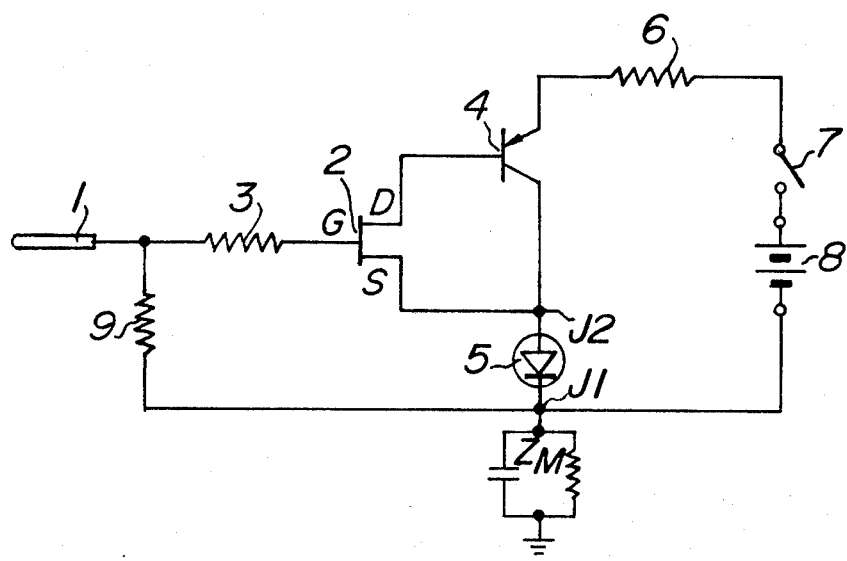
FIG. 1 is a circuit diagram showing a construction of a first embodiment of a voltage detector according to the invention.

FIG. 1 is a circuit diagram of a first embodiment of a voltage detector according to the invention. This voltage detector comprises a probe 1 made of an electrically conductive metal rod and an n-type field effect transistor 2 (hereinafter referred as FET for the sake of simplicity) having a gate electrode G connected to a rear end of the probe 1 through a high ohmic resistor 3. The voltage detector further comprises a pnp-type transistor 4 having a base connected to a drain electrode D of the FET 2 and a light emitting diode 5 connected in series with an emitter-collector path of the transistor 4. The emitter of the transistor 4 is connected through a current limiting resistor 6 and a power switch 7 to a positive terminal of a battery 8. A negative terminal of the battery 8 is connected to a cathode of the light emitting diode 5 and a first junction point $J_1$ therebetween is connected to the probe 1 through a high input resistor 9. A source electrode S of the FET 2 is connected to a second junction point $J_2$ between the collector of the transistor 4 and the light emitting diode 5.

Figure 2:
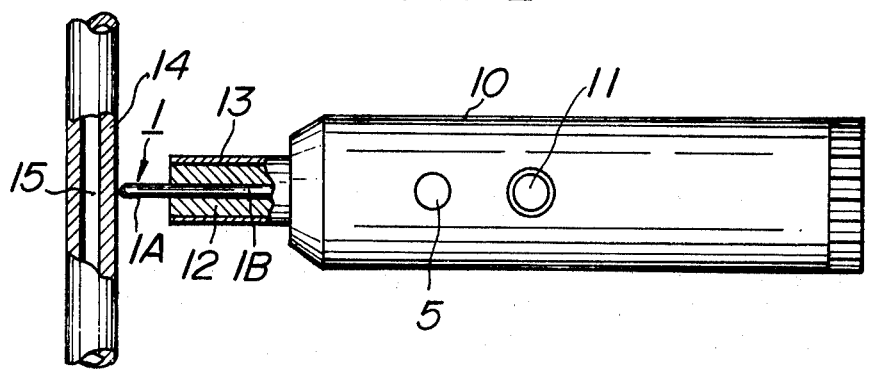
FIG. 2 is a plan view illustrating an outer appearance of the voltage detector.

FIG. 2 is a plan view showing a casing 10 made of electrically insulating material such as synthetic resin. The almost all circuit elements are accommodated in the casing 10, but a front portion 1A of the probe 1 is projected from the casing 10. In this embodiment the casing 10 is formed as a cylindrical body and the light emitting diode 5 and a push button 11 for actuating the power switch 7 are arranged in an outer surface of the casing 10. According to this embodiment the high input resistor 9 is formed by a cylindrical body 12 of electrically insulating material such as synthetic resin and a rear portion 1B of the probe 1 is embedded in the cylindrical body 12. This cylindrical body 12 is further inserted into a metal sleeve 13 and this metal sleeve 13 is connected to the first junction point $J_1$.

As shown in FIG. 2 when the probe 1 of the voltage detector is contacted upon an insulating coating 14 of an electric wire 15 with grasping the casing 10 and an A.C. voltage is applied to the conductive wire 15, the first junction point $J_1$ is coupled to the ground through an equivalent impedance ZM of a human body and a voltage is induced in the probe 1 through a capacitance of the insulating coating 14. Thus when the power switch 7 is closed by actuating the push button 11, the channel of the FET 2 is made periodically conductive during a positive half period of the applied A.C. voltage. That is to say the FET 2 is made conductive at a frequency of the A.C. voltage applied to the conductive wire 15. During the negative half period of the applied A.C. voltage the FET 2 is biased in a cut-off condition by means of a pinch-off voltage produces across the light emitting diode 5. When the FET 2 is made conductive, the transistor 4 is made also conductive, so that across the light emitting diode 5 there is applied a sufficiently high voltage and the diode 5 emits a sufficient amount of light. In this manner the light emitting diode 5 produces light at the frequency of the A.C. voltage. In general since the A.C. voltage has a frequency of 50 Hz or 60 Hz, the light emitting diode 5 is seen to generate light continuously. This light can be seen from the external of the casing.

Since the voltage detector according to the invention has a very high input impedance the sensitivity is quite high and thus the voltage can be detected upon the electrically insulating coating 14 without making the probe directly contact with the conductor 15. Of course, it is also possible to detect the voltage by making the probe 1 directly contact with the conductive wire 15. Even in this case the high ohmic resistor 3 can protect the circuit.

As described above the voltage detector according to the invention can detect the A.C. voltage and the light emitting diode is seen to emit continuous light. The voltage detector also responds to electrostatic charge so as to produce continuous light. Therefore, the user of the voltage detector cannot distinguish the A.C. voltage from the electrostatic charge. In practice this is not suitable for the user. Moreover in some cases it is desirable to discriminate the commercially available 50 Hz and 60 Hz A.C. voltages.

FIG. 3 is a circuit diagram showing a second embodiment of the voltage detector according to the invention. The voltage detector of this embodiment can distinguish between the A.C. voltage and electrostatic charge and between 50 Hz and 60 Hz A.C. voltages. According to this embodiment a switching device 21 is connected in series with the battery 8 and a self-running type multivibrator 22 is connected across a series circuit of the power switch 7 and the battery 8. An oscillating frequency of the multivibrator 22 can be changed by adjusting a variable resistor 23. This variable resistor 23 is so adjusted that the multivibrator 22 produces an oscillation of, for example 53.5 Hz. Then this oscillation is applied to the switching device 21 so that the series circuit of the transistor 4 and the light emitting diode 5 is energized at a frequency of 53.5 Hz. Therefore when the probe 1 detects the A.C. voltage of 50 Hz, the light emitting diode 5 produces flickering light periodically at a beat frequency of 50 Hz and 53.5 Hz, i.e. 3.5 Hz. Whereas when the A.C. voltage of 60 Hz is induced in the probe 1, the light emitting diode 5 produces flickering light periodically at a beat frequency of 60 Hz and 53.5 Hz, i.e., 6.5 Hz. In this manner it is possible to distinguish 50 Hz A.C. voltage from 60 Hz A.C. voltage by means of a flickering rate of light emitted from the diode 5. Further when the electrostatic charge is detected, the light emitting diode 5 produces light at the frequency of the oscillation (53.5 Hz) from the multivibrator, so that the light emitting diode 5 is seen to produce light continuously. In this manner D.C. voltage can be distinguished from A.C. voltage.

In the present embodiment there is further provided a high ohmic resistor 24 and a switch 25 connected in series with the resistor 24. This series circuit is connected between the gate electrode of the FET 2 and the first junction point $J_1$. When the switch 25 is closed, the resistor 24 is connected into the circuit, so that the sensitivity of the voltage detector is reduced. Therefore it is possible to detect the voltage accurately without being affected by stray current.

In the second embodiment shown in FIG. 3 there are provided two switches 7 and 25 and thus corresponding two actuating members must be provided in the casing. It is rather troublesome for the user to operate those two switch actuating members. FIGS. 4 and 5 are cross-sectional views illustrating one embodiment of a construction of a space for accommodating the battery means. The casing 10 is formed as a cylindrical tube and has a hollow space 31 in which two battery cells 8A and 8B can be inserted in series with each other. The casing 10 has an opening 32 at an end remote from the probe 1 and on an inner surface of the opening 32 is formed a thread 33. Into this threaded inner surface 33 a lid 34 having a corresponding threaded outer surface 35 can be detachably screwed. At a bottom surface of the lid 34 is secured a metal disc plate 36. Inner surface of the casing 10 adjacent to the threaded portion 35 there is fixed a metal ring 37, the inner diameter of this metal ring 37 is made larger than a diameter of the battery cell 8A, 8B, but is made smaller than a diameter of the metal disc plate 36. In FIG. 5, a partition 38 is formed integrally with the casing 10 at the bottom of the space 31 and to this partition there is secured a leaf spring 39 which can contact with one terminal of the battery means, in this embodiment a negative terminal of the battery cell 8A installed in the space 31. An electric wire 40 is connected to the leaf spring 39. To the metal ring 37 there is connected another electric wire 41 which extends through a hole formed in the partition 38.

When the lid 34 is screwed into the opening 33 to such an extent that the metal plate 36 is urged against the metal ring 37, the battery cells 8A and 8B are electrically connected to the electric wires 40 and 41, so that the circuit of the voltage detector is energized. When the lid 34 is unscrewed to such an extent that the metal plate 36 leaves the metal ring 37, the positive terminal of the battery cell 8B is disconnected from the metal ring 37 so that the circuit of the voltage detector is deenergized. In this manner by means of rotating the lid 34 to a small extent the battery cells 8A, 8B can be connected into or disconnected from the circuit and thus a separate power switch actuating member can be omitted.

In the above construction of the battery accommodating space the lid 34 is remained in an unscrewed position during the voltage detector is not used. Therefore the lid 34 might be unscrewed to a great extent and in an extreme case the lid 34 might be dropped from the opening 32. In order to avoid such a disadvantage a click mechanism can be provided as shown in FIG. 6. A sleeve 42 is secured to the casing 10 at a position of the opening 32 and a ball 43 is inserted in the sleeve 42 in such a manner that a portion of the ball extends from the open end of the sleeve 42 by the action of a coiled spring 44. On that surface portion of the lid 34 which faces the ball 43 there is formed a recess 45. When the lid 34 is unscrewed to a given position, the ball 44 fits into the recess 45 and thus the lid does hardly loose furthermore. In this manner it is prevented that the lid 34 might be dropped from the casing 10. If the lid 34 is further unscrewed by a greater force, the recess 45 can go beyond the ball 44 and then the lid 34 can be easily unscrewed, so that the lid 34 can be removed from the casing 10.

As described above in order to obtain the high input impedance the resistor 9 having a quite high resistance should be connected to the probe 1. This input circuit can be expressed equivalently as shown in FIG. 7, i.e, it can be represented as a parallel circuit of a resistor 51 and a capacitor 52. The resistance value of this resistor 51 must be about $10^{11}\Omega$ and the capacitance value of the capacitor 52 must be about several pico-farads so as to obtain a time constant of smaller than 0.3 seconds. This time constant is necessary for the voltage detector to operate in a satisfactory manner. In the embodiment shown in FIG. 2, this high ohmic resistor 9 is formed by the insulating sleeve 12. But in this construction the resistance value is liable to change within a wide range in accordance with a pressure which is produced at an instance when the insulating sleeve 12 is inserted in the metal sleeve 13. Moreover the resistance value of the sleeve 12 is also changed owing to temperature variation. Therefore it is very difficult to obtain the given resistance value of the resistor 9, as well as to keep the given resistance value. If the value of the resistor 9 is too high, the time constant becomes too large, so that the electric charge on the probe is hardly discharged. Moreover if the resistance value is too low, the time constant becomes unacceptably small and the amplification of the succeeding transistor stage becomes decreased.

Figure 8:
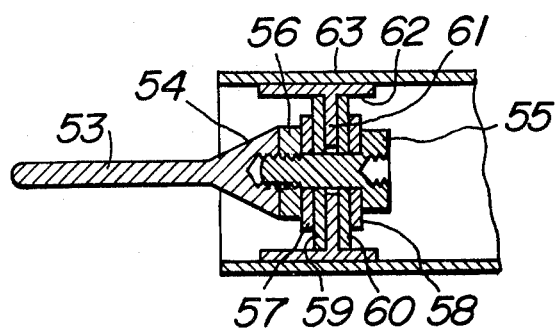
FIG. 8 is a cross sectional view showing one embodiment of an input device of the voltage detector according to the invention.

FIG. 8 is a cross-sectional view of another embodiment of the input circuit of the voltage detector according to the invention. In this embodiment a probe 53 is formed by a metal rod having a tapered portion 54 at its bottom end. To the tapered portion 54 is screwed a bolt 55 made of a metal having a relatively large thermal expansion coefficient such as aluminum. The thermal coefficient of aluminium is about $2.3 \times 10^{-5}/°$ C. To the bolt 55 is also screwed a nut 56 and between this nut 56 and a flange of the bolt 55 there are inserted a pair of metal washers 57 and 58 and a pair of disc-shaped resistors 59 and 60. Between the pair of disc-shaped resistors 59 and 60 is inserted a flange 61 of an inner metal sleeve 62. This inner metal sleeve 62 is inserted into an outer metal sleeve 63. The disc-shaped resistors 59, 60 is formed by an electrically insulating material having a thermal expansion coefficient lower than that of the bolt 55. In this embodiment these resistors are made of black bakelite which has a thermal expansion coefficient of about $0.8 \times 10^{-5} \sim 1.5 \times 10^{-5}/°$ C.

Figure 9:
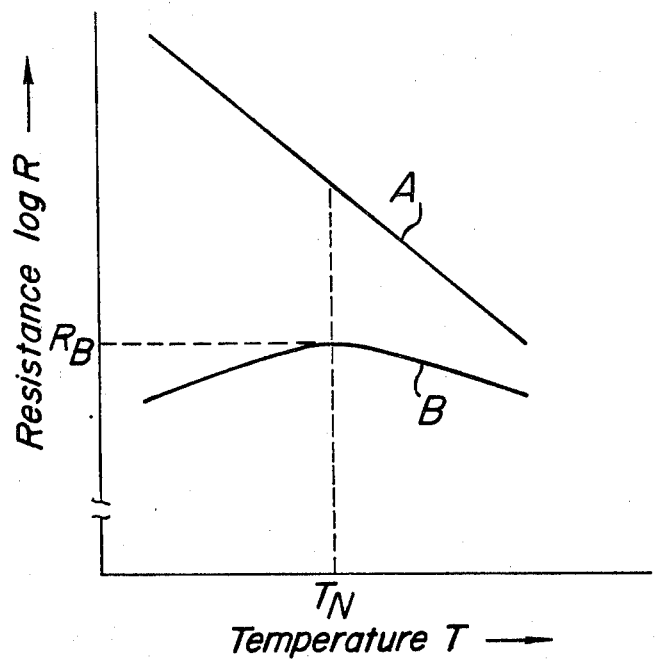
FIG. 9 is a graph illustrating temperature characteristics of an input resistance device of FIG. 8.

As is well-known the resistance value of the resistor 59, 60 is decreased as the temperature becomes higher as shown by a curve A in FIG. 9. Moreover when the bolt 55 is screwed in a direction for increasing the clamping force, contact areas between the washers 57, 58 and flange 61 and the resistors 59, 60 are increased, and thus the resistance value of the assembly is made lowered. Now the bolt 55 is fixed to obtain a desired resistance value $R_B$ at a temperature $T_N$. Then the resistance value is held substantially constant even if the temperature is varied within a wide range. This is due to the following fact. When the temperature is decreased, the bolt 55 shrinks to a larger extent than the resistors 59, 60, so that the contact resistance becomes increased. Thus the increase of the resistance value due to the temperature decrease is compensated for by the increased contact resistance. When the temperature is increased, the bolt 55 is expanded to a greater extent than the resistors 59, 60 and thus the contact resistance becomes higher. Therefore the decreased resistance value due to the lowered temperature is substantially compensated for by the increased contact resistance. In this manner the resistance value of the resistor assembly shown in FIG. 8 has a temperature characteristic curve B as shown in FIG. 9, which is substantially flat within a quite wide temperature range.

FIG. 10 is a cross-sectional view illustrating another embodiment of the high impedance input device. In this embodiment a pair of the resistor assemblies shown in FIG. 8 are provided and they are connected in parallel with each other. As shown in FIG. 11 one of these resistor assemblies has a temperature characteristic curve $B_1$ which has a peak at a temperature $T_L$ lower than the room temperature and the other has a temperature characteristic curve $B_2$ which has a peak at a temperature $T_H$ higher than the room temperature. Then a composite resistance value has a temperature characteristic curve C which has a flat portion over a relatively wide temperature range. The pair of the resistor assemblies may be connected in series with each other and then a temperature characteristic curve D may be obtained.

In the embodiment illustrated in FIG. 10 there is further provided a metal sleeve 64 which is slidably mounted on the outer metal sleeve 63. When this movable metal sleeve 64 is projected so as to enclose a substantial portion of the probe 53 as shown by a chain line, a capacitance value between the probe 53 and the outer metal sleeve 63 is increased. In this manner the time constant of the high impedance input device can be adjusted by projecting the movable metal sleeve 64. Moreover by projecting the metal sleeve 64, the detection sensitivity of the voltage detector can be decreased and the influence of electric fields other than that to be detected can be eliminated.

Figure 12:
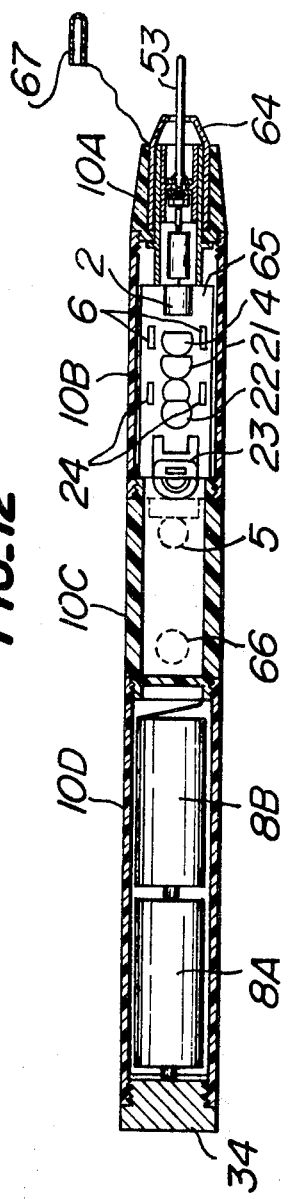
FIG. 12 is a cross sectional view showing another embodiment of the voltage detector according to the invention.

FIG. 12 is a cross-sectional view illustrating still another embodiment of the voltage detector according to the invention. This voltage detector has an electrical circuit shown in FIG. 3 and the high input impedance device has the resistor assembly depicted in FIG. 8. In this embodiment the casing is composed of four sections 10A, 10B, 10C and 10D which are mechanically coupled to each other. In the first casing section 10A there are arranged a rear portion of a probe 53, a resistor assembly, an outer metal sleeve 63 and a slidable metal sleeve 64. In the outer metal sleeve 63 there is arranged the high ohmic series resistor 3. In the second casing portion 10B there is inserted a print circuit board 65 on which are arranged the FET 2, the transistor 4, the resistors 6 and 24, the switching transistor 21, the multivibrator 22 and the variable resistor 23. On the surface of the third casing section 10C there are provided the light emitting diode 5 and a push button 66 for actuating the switch 25. The fourth casing section 10D defines the space for accommodating the battery cells 8A and 8B. As explained above with reference to FIGS. 4 and 5 the lid 34 is detachably secured to the opening of the battery accommodating space. Further the voltage checker of this embodiment comprises a probe cap 67 made of electrically insulating material. When the probe cap 67 is inserted into the probe 53 the sensitivity of voltage checker becomes lowered so as to prevent the influence of stray currents. As mentioned above when the push button 66 is depressed so as to actuate the switch 25, the sensitivity is further decreased.

As described above in detail the voltage detector according to the invention has the extremely high input impedance and thus the very high sensitivity. Therefore the voltage checking operation can be effected even with interposing the insulating coatings of the electric wires. But in some cases this high sensitivity causes spurious detection. For instance if there are wired a plurality of lines side by side the voltage detector cannot separately check each one of these lines due to an electrostatic induction between these lines. Moreover in case of using two adjacent electric apparatuses without being connected to the ground and one of them being connected to the power supply, but the other being not connected to the power supply, the voltage is induced on a casing of the other apparatus by means of electrostatic capacitance between these apparatuses. Therefore if the probe of the voltage detector according to the invention is made contact with the casing of the other apparatus the induced voltage is detected. However in practice this induced voltage is not entirely harmful at all and thus the detector should not respond to such an induced voltage.

Figure 13:
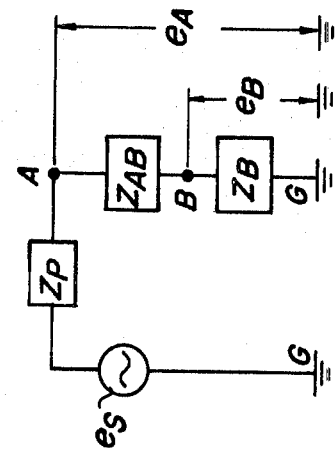
FIG. 13 is an equivalent circuit of two apparatuses arranged side by side.

FIG. 13 is an equivalent circuit for illustrating the two adjacent apparatuses, in which $e_s$ represents the power supply, $Z_A$ an impedance of one apparatus, $Z_{AB}$ an impedance of a stray capacitance between these apparatuses, $Z_B$ an impedance of the other apparatus, $e_A$ a voltage across the casing of the first apparatus and the ground G and $e_B$ is a voltage produced across the casing of the second apparatus and the ground G. These voltages $e_A$ and $e_B$ can be expressed as follows.

$$e_A = \frac{(Z_{AB} + Z_B)e_s}{Z_A + Z_{AB} + Z_B}$$

$$e_B = \frac{Z_B e_s}{Z_A + Z_{AB} + Z_B}$$

In these equations the following relation is generally applied.

$$Z_A < Z_{AB} < Z_B$$

Thus the voltage $e_A$ will assume more than several ten percentages of the source voltage $e_s$ and $e_B$ will be less than several ten percentages of $e_s$. This results in that when the probe is made contact with the casings of the first and second apparatuses, respectively, the light emitting diode produces light in both cases. Therefore the user will feel fear that the alternating source voltage might be applied to the casings.

Figure 14:
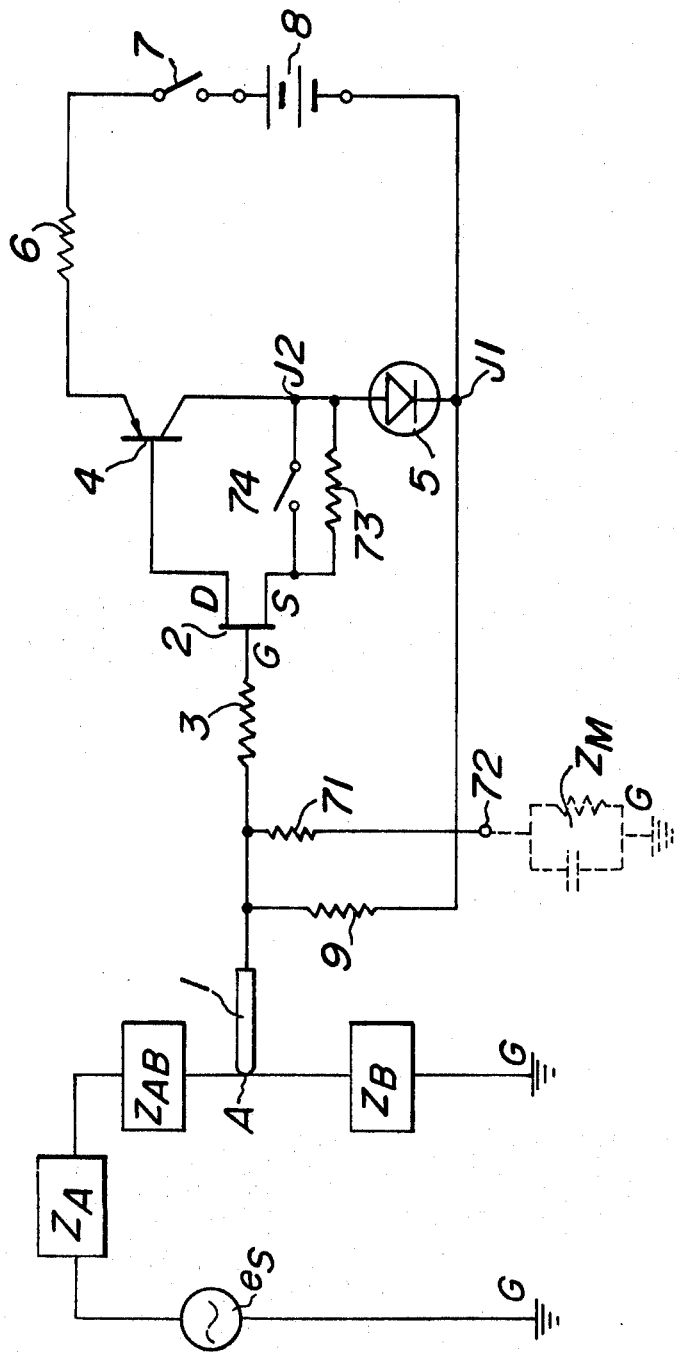
FIG. 14 is a circuit diagram of another embodiment of the voltage detector according to the invention.

FIG. 14 is a circuit diagram of further embodiment of the voltage detector according to the invention. In this embodiment the probe 1 may be connected to the ground G through a protecting resistor 71, an exposed electrode 72 provided in the casing of the detector and the equivalent impedance $Z_M$ of the user. The protecting resistor 71 is made lower than the impedance $Z_B$ and generally has a value between 400 KΩ and 1 MΩ. When the probe 1 is made contact with a point A and the user touches the exposed electrode 72 with his finger, a current flows through the protecting resistor 71, the electrode 72 and the impedance $Z_M$ to the ground G and thus the voltage between the point A and the ground G is extremely lowered. Then the detector cannot respond to such a lowered voltage and the light emitting diode 5 does not emit light. In this manner the spurious detection can be avoided by simply touching the electrode 72 with the user's finger.

Since the protecting resistor 71 must limit the current flowing therethrough so as to protect the user from the electric shock, its resistance value could not be reduced lower than the given minimum value, e.g. 200 KΩ. Therefore in some cases the spurious detection might occur even if the user touches the exposed electrode 72 with his finger. In order to avoid such inconvenience according to this embodiment there is provided a parallel circuit of a resistor 73 and a switch 74 of a normally closed type. When the switch 74 is opened by actuating a push button 75 (see FIG. 15), the resistor 73 is connected across the source electrode S of the FET 2 and the collector of the transistor 4 and a negative feedback is applied to the FET so as to decrease the sensitivity of detection.

Figure 15:
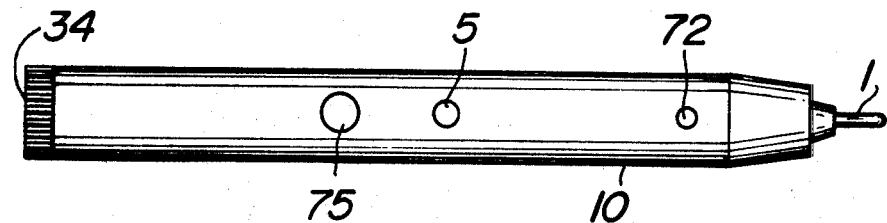
FIG. 15 is a plan view showing the outer appearance of the voltage detector of FIG. 14.

FIG. 15 is a plan view showing the outer appearance of the voltage detector of this embodiment. The electrode 72 is provided in the insulating casing 10 at a position relatively near the probe 1, so that the probe 1 can be connected to the electrode 72 by means of a relatively short electric wire to avoid the influence of external electric field. The push button 75 is provided for actuating the switch 74.

Figure 16:
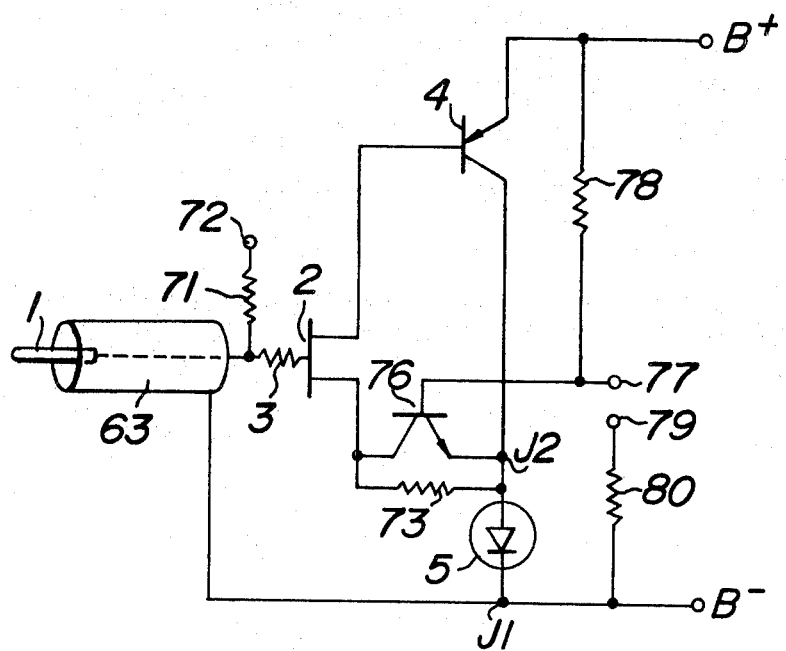
FIG. 16 is a circuit diagram of still another embodiment of the voltage detector according to the invention.

FIG. 16 is a circuit diagram of another embodiment of the voltage detector according to the invention. In this embodiment the switch 74 shown in FIG. 14 is replaced by a switching transistor 76 having an emitter-collector path connected across the feedback resistor 73. A base electrode of this switching transistor 76 is connected to a second electrode 77 and this second electrode 77 is connected through a resistor 78 to the emitter of the amplifying transistor 4. A third electrode 79 is further provided adjacent to the second electrode 77 and this third electrode 79 is connected to the junction point $J_1$ through a resistor 80.

Figure 17:
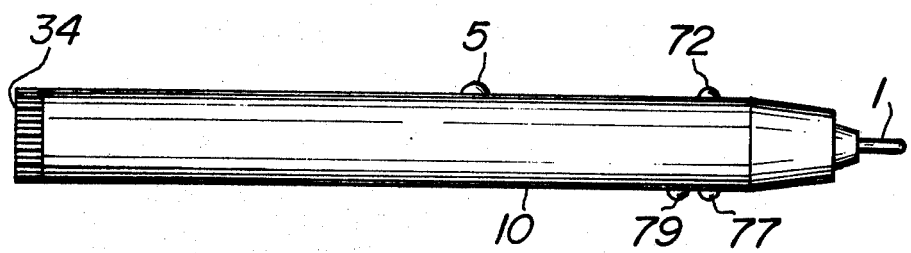
FIG. 17 is a plan view of the voltage detector shown in FIG. 16.

FIG. 17 is a plan view illustrating an outer appearance of the voltage detector of this embodiment. The first electrode 72 is arranged on one side surface of the casing 10 near the probe 1 and the second and third electrodes 77 and 79 are provided on an opposite side surface of the casing 10 also near the probe 1. Thus the user can touch simultaneously these electrodes 72, 77 and 79 with his fingers. When the second and third electrodes 77 and 79 are coupled together by means of the user's finger the transistor 76 is made blocked and the feedback resistor 73 is connected into the circuit so as to reduce the sensitivity. When the electrodes 77 and 79 are disconnected from each other, the transistor 76 is biased into a conductive condition, so that the feedback resistor 73 is shortcircuited. The resistor 80 is to protect the user from the electric shock which might be occurred when the metal sleeve 63 is erroneously made contact with a member to which a dangerous voltage is applied.

Figure 18:
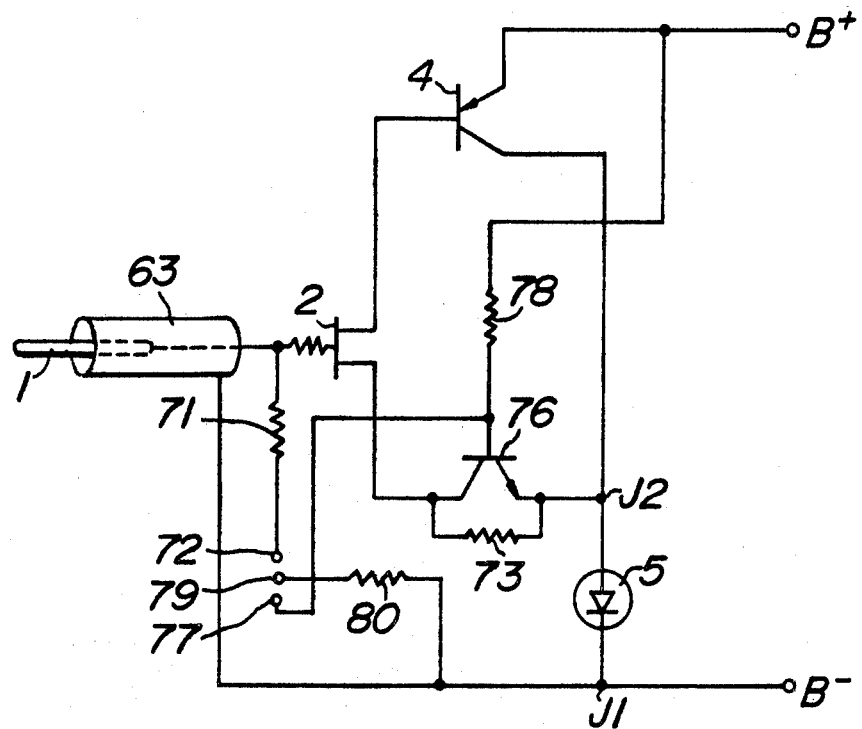
FIG. 18 is a circuit diagram of still another embodiment of the voltage detector according to the invention.
Figure 19:
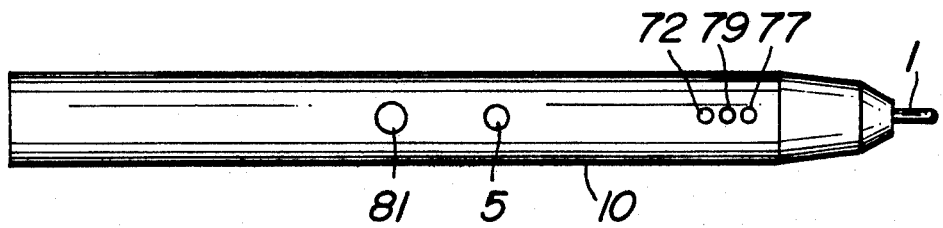
FIG. 19 is a plan view showing the outer appearance of the voltage detector according to the invention.

FIG. 18 is a circuit diagram showing still another embodiment of the voltage detector according to the invention. In this embodiment the first, second and third exposed electrodes 72, 77 and 79 are arranged side by side on the casing 10 near the probe 1 as shown in FIG. 19. Thus these three exposed electrodes 72, 77 and 79 can be simultaneously touched by a finger of the user. The operation of the voltage detector of this embodiment is same as described above with reference to FIGS. 16 and 17.

The voltage detector according to the invention comprises the light emitting diode and the brightness and sensitivity of this diode vary to a greater extent in dependence on the value of the supply source voltage. Therefore it is desirable to check the decrease of the battery voltage at any time. Besides the decrease of the battery voltage it is quite convenient for the user to check the incorrect operation of the voltage detector due to disconnection of circuits, breakdown of circuit elements. However if the voltage detector is provided with such a checking circuit, the voltage detector is liable to be complex in construction and thus to become large in size. Moreover a checking button must also be provided and this might cause supporious operation of the voltage detector. In the voltage detector according to the invention the above mentioned checking can be effected in a very simple manner by rubbing an outer surface of the casing of the voltage detector. This is due to the fact that a circuit portion extends along the inner surface of the casing and thus the electrostatic charge is induced in this circuit portion by rubbing the outer surface of the casing with the user's finger and this induced voltage is checked by the detector so as to produce light. In order to enhance this checking operation a portion of a lead wire may be intentionally provided along the inner surface of the casing.

What is claimed is:

1. A voltage detector comrising:
   a casing of electrically insulating material;
   a probe of electrically conductive metal and having a rear portion inserted in a front portion of the casing and a front portion projecting from the casing;
   a field effect transistor of depletion type having source, gate and drain electrodes, the gate electrode being connected to the rear portion of said probe;
   a transistor having emitter, collector and base, the base being connected to the drain electrode of said field effect transistor;
   a light emitting diode arranged in said casing so that emitted light can be seen from the exterior and connected in series with the emitter-collector path of said transistor;
   a D.C. power source having two terminals connected across a series circuit of the emitter-collector path of the transistor and light emitting diode; and
   high input impedance means connected across said probe and a first junction point between said light emitting diode and said D.C. power source; whereby the source electrode of said field effect transistor being connected to a second junction point between said transistor and said light emitting diode so as to bias said field effect transistor substantially in a pinch-off condition by means of a voltage drop produced across said light emitting diode.

2. A voltage detector according to claim 1 further comrising a metal sleeve arranged to surround the rear portion of the probe within the casing, whereby said high input impedance means is arranged in a space between an inner surface of the metal sleeve and the probe and the metal sleeve is electrically coupled to said first junction point.

3. A voltage detector according to claim 2, wherein said high input impedance means is formed by a cylindrical member made of electrically insulating synthetic resin and said cylindrical member is clamped between the rear portion of the probe and the metal sleeve.

4. A voltage detector according to claim 1 further comprising
   an oscillating circuit for producing a signal having a given frequency $f_M$;
   a switching device inserted in the series circuit of the D.C. power source, the transistor and the light emitting diode and driven by the signal from the oscillator circuit so as to conduct periodically a D.C. current from the D.C. power source at a repetition frequency of $f_M$; whereby the light emitting diode produces flickering light at a beat frequency $f_I$-$f_M$ between the repetition frequency $f_M$ and a frequency $f_I$ of a voltage to be detected.

5. A voltage detector according to claim 1, wherein said high input impedance means comprises one or more disc plates of electrically insulating material, a clamping member for clamping the disc plates and having a thermal expansion coefficient higher than that of said disc plates, whereby the temperature chracteristics of the high input impedance means is made flatened.

6. A voltage detector according to claim 1, wherein said casing has a space for accommodating the battery means and having an opening through which the battery can be inserted into or taken out of the space;
   a lid detachably screwed into said opening of the space;

an electrically conductive plate secured to a rear surface of the lid;

an electrically conductive ring-shaped member arranged at the opening of the space;

an electrically conducting wire connected to said ring-shaped member;

an electrically conductive member arranged at a bottom of the space and being contact with the other electrode of the battery means; and an electrically conductive wire connected to the electrically conductive member; whereby when said lid is screwed into the opening the electrically conductive plate is urged against the electrically conductive ring-shaped member so as to supply a power of the battery means.

7. A voltage detector according to claim 1 further comprising a resistor having one end connected to the probe and an electrode provided on an outer surface of the casing and connected to the other end of the high ohmic resistor, whereby when said electrode is touched by a finger of a user the probe is connected to the ground through the high ohmic resistor and an equivalent impedance of the user.

8. A voltage detector according to claim 1 further comprising a pair of electrodes provided on the casing and a feedback means for said field effect transistor connected across said pair of electrodes, whereby when said pair of electrodes are touched by a user's finger, the feedback circuit is connected into the circuit so as to decrease the sensitivity of the detection.

9. A voltage detector according to claim 8 further comprising a pair of electrodes provided on the casing and a feedback circuit means connected across the pair of electrodes, said pair of electrodes being arranged near the first electrode.

10. A voltage detector comprising a casing of electrically insulating material;

a probe of electrically conductive metal and having a rear portion inserted in a front portion of the casing and a front portion projected from the casing;

a field effect transistor having source, gate and drain electrodes, the gate electrode being connected to the rear portion of the probe;

a transistor having emitter, collector and base, the base being connected to the drain electrode of the field effect transistor;

a light emitting diode arranged in the casing so that emitted light can be seen from the external and connected in series with the emitter-collector path of the transistor;

a D.C. power source having two terminals connected across a series circuit of the emitter-collector path of the transistor and light emitting diode; and high input impedance means connected across the probe and a first junction point between the light emitting diode and the D.C. power source; the source electrode of the field effect transistor being connected to a second junction point between the transistor and the light emitting diode;

an oscillating circuit for producing a signal having a given frequency $f_M$;

a switching device inserted in the series circuit of the D.C. power source, the transistor and the light emitting diode and driven by the signal from the oscillator circuit so as to conduct periodically a D.C. current from the D.C. power source at a repetition frequency of $f_M$, whereby the light emitting diode produces flickering light at a beat frequency $f_I-f_M$ between the repetition frequency $f_M$ and a frequency $f_I$ of a voltage to be detected.

11. A voltage detector comprising:
a casing of electrically insulating material;
a probe of electrically conductive metal and having a rear portion inserted in a front portion of the casing and a front portion projected from the casing;
a field effect transistor having source, gate and drain electrodes, the gate electrode being connected to the rear portion of the probe;
a transistor having emitter, collector and base, the base being connected to the drain electrode of the field effect transistor;
a light emitting diode arranged in the casing so that emitted light can be seen from the external and connected in series with the emitter-collector path of the transistor;
a D.C. power source having two terminals connected across a series circuit of the emitter-collector path of the transistor and light emitting diode; and
high input impedance means connected across the probe and a first junction point between the light emitting diode and the D.C. power source; the source electrode of the field effect transistor being connected to a second junction point between the transistor and the light emitting diode;
a resistor having one end connected to the probe and an electrode provided on an outer surface of the casing and connected to the other end of the high ohmic resistor, whereby when said electrode is touched by a finger of a user the probe is connected to the ground through the high ohmic resistor and an equivalent impedance of the user.

12. A voltage detector comprising:
a casing of electrically insulating material;
a probe of electrically conductive metal and having a rear portion inserted in a front portion of the casing and a front portion projected from the casing;
a field effect transistor having source, gate and drain electrodes, the gate electrode being connected to the rear portion of the probe;
a transistor having emitter, collector and base, the base being connected to the drain electrode of the field effect transistor;
a light emitting diode arranged in the casing so that emitted light can be seen from the external and connected in series with the emitter-collector path of the transistor;
a D.C. power source having two terminals connected across a series circuit of the emitter-collector path of the transistor and light emitting diode; and
high input impedance means connected across the probe and a first junction point between the light emitting diode and the D.C. power source; the source electrode of the field effect transistor being connected to a second junction point between the transistor and the light emitting diode;
a pair of electrodes on the casing and feedback means for said field effect transistor connected across said pair of electrodes, whereby when said pair of electrodes are touched by a user's finger, the feedback circuit is connected into the circuit so as to decrease the sensitivity of the detection.

13. A voltage detector according to claim 12 further comprising a pair of electrodes on the casing and feedback circuit means connected across the pair of electrodes, said pair of electrodes being arranged near the first electrode.

14. A voltage detector according to claim 1, further comprising capacitive means which can be selectively coupled between an object to be checked and the gate electrode of said field effect transistor.

* * * * *